(12) United States Patent
Kerrigan et al.

(10) Patent No.: US 7,751,990 B2
(45) Date of Patent: Jul. 6, 2010

(54) DETECTING A FOULED AIR FILTER IN A COMPUTER EQUIPMENT ENCLOSURE

(75) Inventors: Brian M. Kerrigan, Cary, NC (US); Randolph S. Kolvick, Durham, NC (US); Jason A. Matteson, Raleigh, NC (US); Thomas D. Pahel, Jr., Raleigh, NC (US); Mark E. Steinke, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/176,795

(22) Filed: Jul. 21, 2008

(65) Prior Publication Data

US 2010/0017151 A1 Jan. 21, 2010

(51) Int. Cl.
*G01B 3/44* (2006.01)
(52) U.S. Cl. .................................... 702/34
(58) Field of Classification Search ............. 702/34
See application file for complete search history.

(56) References Cited

U.S. PATENT DOCUMENTS

| | | | |
|---|---|---|---|
| 4,654,140 A | 3/1987 | Chen | |
| 4,751,501 A | 6/1988 | Gut | |
| 5,702,592 A | 12/1997 | Suri et al. | |
| 5,774,056 A * | 6/1998 | Berry et al. | 340/607 |
| 6,136,068 A | 10/2000 | Peters | |
| 7,178,410 B2 * | 2/2007 | Fraden et al. | 73/861.52 |
| 2008/0198896 A1 * | 8/2008 | Nair | 374/141 |

FOREIGN PATENT DOCUMENTS

| | | |
|---|---|---|
| JP | 2000-171685 | 6/2000 |
| JP | 2001-252513 | 9/2001 |
| JP | 2003-115683 | 4/2003 |
| JP | 2004-263989 | 9/2004 |
| JP | 2006-100309 | 4/2006 |
| JP | 2007-201174 | 8/2007 |

* cited by examiner

*Primary Examiner*—Aditya Bhat
(74) *Attorney, Agent, or Firm*—H. Artoush Ohanian; Cynthia G. Seal; Biggers & Ohanian, LLP.

(57) ABSTRACT

Detecting a fouled air filter in a computer equipment enclosure that includes an air filter, a supply plenum connecting the air filter and the computer equipment enclosure, a fan operating at a current fan speed, and a filter monitoring module connected for data communications to a management module. Detecting a fouled air filter according to embodiments of the present invention includes calculating, by the filter monitoring module, a pressure differential across the air filter; determining, for the current fan speed by the filter monitoring module in dependence upon a pressure differential profile for the air filter, whether the calculated pressure differential across the air filter exceeds a predetermined threshold value; and if the calculated pressure differential across the air filter exceeds the predetermined threshold value, reporting, by the filter monitoring module to the management module, that the calculated pressure differential across the air filter exceeds the predetermined threshold value.

15 Claims, 2 Drawing Sheets

DETECTING A FOULED AIR FILTER IN A COMPUTER EQUIPMENT ENCLOSURE

BACKGROUND OF THE INVENTION

1. Field of the Invention

The field of the invention is data processing, or, more specifically, methods, apparatus, and products for detecting a fouled air filter in a computer equipment enclosure.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

As computer systems today are put to use in environments with high levels of airborne particulate materials, heat sinks and other electronic devices within computer enclosures collect such materials. This creates a situation where air flow can become limited, subjecting electronic components within the enclosure to reach temperatures beyond their thermal limits, causing malfunctions. To mitigate this problem, air filters may be added to the enclosure such that the airborne particulate materials are filtered from airflow entering the enclosure, reducing the collection of the materials on components within the enclosure.

Air filters, however, become fouled over time due to collection of the filtered particulate materials and must be replaced or cleaned. A fouled air filter reduces the amount of airflow into the enclosure and the amount of cooling that is provided by such airflow. In such computer enclosures today, aside from physical visual inspection of an air filter, there is no cost effective, efficient method of detecting a fouled air filter.

SUMMARY OF THE INVENTION

Methods, apparatus, and products for detecting a fouled air filter in a computer equipment enclosure. In embodiments of the present invention the computer equipment enclosure includes an air filter, a supply plenum connecting the air filter and the computer equipment enclosure, a fan operating at a current fan speed, the fan providing airflow across computer equipment installed in the computer equipment enclosure, and a filter monitoring module connected for data communications to a management module, the management module capable of managing the computer equipment enclosure and computer equipment installed in the computer equipment enclosure.

Detecting a fouled air filter in a computer equipment enclosure according to embodiments of the present invention includes calculating, by the filter monitoring module, a pressure differential across the air filter; determining, for the current fan speed by the filter monitoring module in dependence upon a pressure differential profile for the air filter, whether the calculated pressure differential across the air filter exceeds a predetermined threshold value; and if the calculated pressure differential across the air filter exceeds the predetermined threshold value, reporting, by the filter monitoring module to the management module, that the calculated pressure differential across the air filter exceeds the predetermined threshold value.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
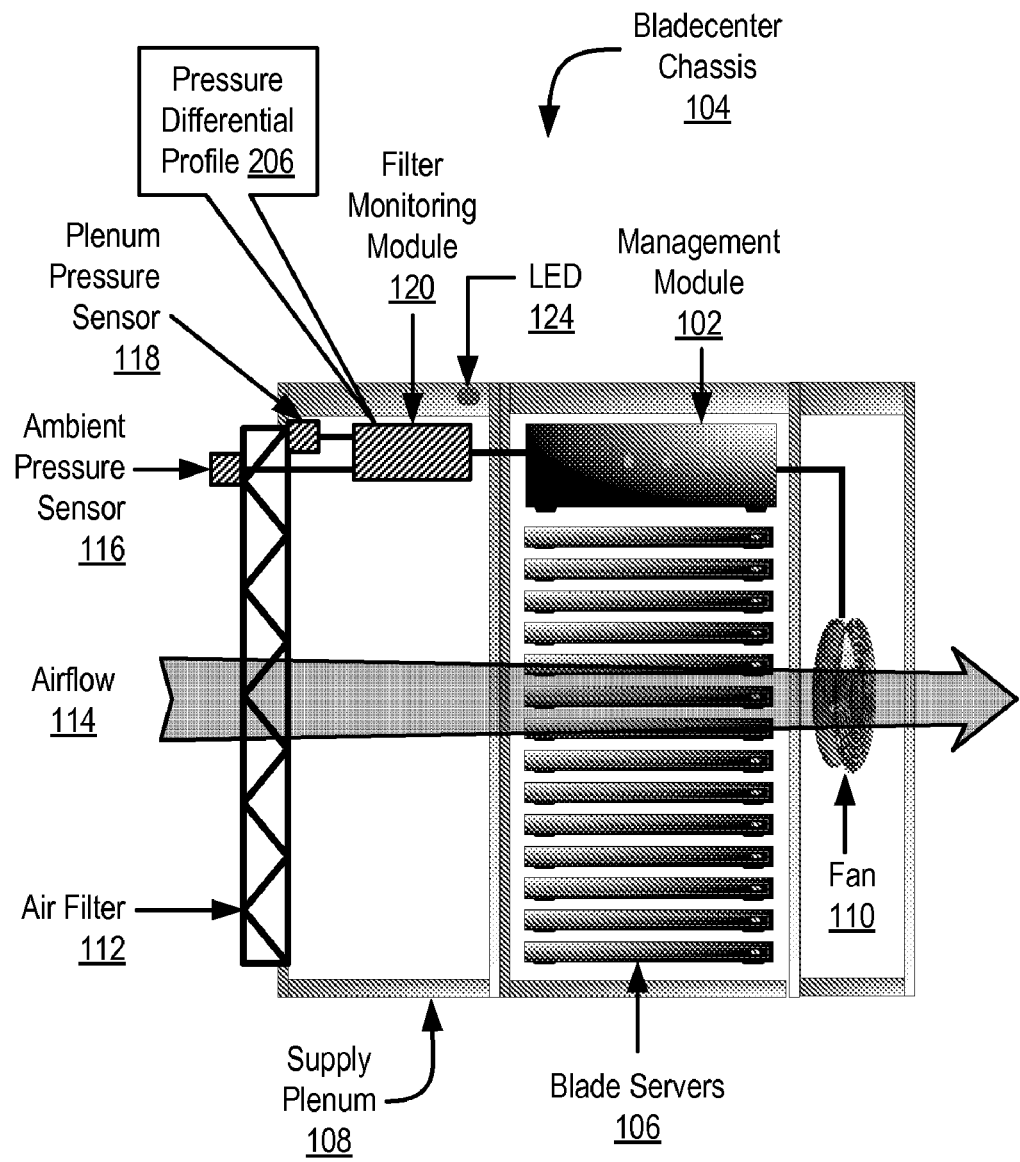
FIG. 1 sets forth a functional block diagram of a system for detecting a fouled air filter in a computer equipment enclosure according to embodiments of the present invention.

Exemplary methods, apparatus, and products for detecting a fouled air filter in a computer equipment enclosure in accordance with the present invention are described with reference to the accompanying drawings, beginning with FIG. 1. FIG. 1 sets forth a functional block diagram of a system for detecting a fouled air filter in a computer equipment enclosure according to embodiments of the present invention. A computer equipment enclosure is a system that houses various electronic components. Examples of computer equipment enclosures include computer equipment racks, personal computer enclosures, and others systems that house electronic components as may occur to those of skill in the art.

A computer equipment rack is a system for mounting various electronic modules in a stack. Some conventional computer equipment racks are 19 inches wide and are divided into subracks. Each subrack is typically measured in rack units. Each rack unit, designated as '1U,' is 1.75 inches in height. As an example, a rack may be a 19 inch, 24U rack, that is, 19 inches wide with 24, 1.75 inch high subracks. Typical computer equipment racks may include such electronic modules as servers, network switches, routers, power supplies, power distribution units, management modules, and other electronic modules as will occur to those of skill in the art.

Depicted in the system of FIG. 1, is one example computer equipment enclosure, a bladecenter chassis (104). A bladecenter chassis, also referred to as a 'blade enclosure' or a 'bladecenter,' is an example of a computer equipment enclosure designed specifically to house a number of blade servers (106) along with other electronic equipment, such as Ethernet switches, routers, power supplies, and so on as will occur to those of skill in the art. A bladecenter chassis provides services such as power, cooling, networking, various interconnects and management for blade servers installed in the bladecenter chassis.

A server is, as the term is used in this specification, refers generally to a multi-user computer that provides a service (e.g. database access, file transfer, remote access) or resources (e.g. file space) over a network connection. The term 'server,' as context requires, refers inclusively to the server's computer hardware as well as any server application software or operating system software running on the server. A server application is an application program that accepts connections in order to service requests from users by sending back responses. A server application can run on the same computer as the client application using it, or a server application can accept connections through a computer network. Examples of server applications include file server, database server, backup server, print server, mail server, web server, FTP servers, application servers, VPN servers, DHCP servers, DNS servers, WINS servers, logon servers, security servers, domain controllers, backup domain controllers, proxy servers, firewalls, and so on.

Blade servers are self-contained servers, designed for high density. As a practical matter, all computers are implemented with electrical components requiring power that produces heat. Components such as processors, memory, hard drives, power supplies, storage and network connections, keyboards, video components, a mouse, and so on, merely support the basic computing function, yet they all add bulk, heat, complexity, and moving parts that are more prone to failure than solid-state components. In the blade paradigm, most of these functions are removed from the blade computer, being either provided by the bladecenter chassis (DC power) virtualized (iSCSI storage, remote console over IP), or discarded entirely (serial ports). The blade itself becomes simpler, smaller, and amenable to dense installation with many blade servers in a single bladecenter chassis.

Also installed in the bladecenter chassis (104) of FIG. 1 is a management module (102) capable of managing the bladecenter chassis and computer equipment installed in the computer equipment enclosure, such as for example the blade servers (106), the fan (110), power supplies installed in the bladecenter chassis, data communications switches installed in the bladecenter chassis, data communications routers installed in the bladecenter, and so on.

The bladecenter chassis (104) of FIG. 1 also includes an air filter (112) connected by a supply plenum (108) to the bladecenter chassis (104). An air filter is device that removes particulate material from an air stream that flows through the filter. Over time, such particulate materials may build up on the side of the air filter through which the stream of air enters 'fouling' the air filter. As mentioned above, a fouled air filter reduces the amount of airflow (114) into the bladecenter chassis (104) and the amount of cooling in the bladecenter chassis that is provided by such airflow. As cooling inside the bladecenter chassis is reduced, the electronic components installed in the bladecenter chassis, such as the blade servers (106) for example, may overheat and fail.

A supply plenum (108) is a chamber or a region in a bladecenter chassis from which airflow is supplied to computer equipment installed in the bladecenter chassis. In the example of FIG. 1, a fan (110), sometimes referred to as a 'blower,' is installed in the bladecenter chassis. The fan (108) is a device that provides the airflow (114) from the supply plenum (108) across computer equipment installed in the bladecenter chassis (104) such as the blade servers (106) and management module for example. The fan (110) is capable of operating at various fan speeds for dynamic control of temperature inside the chassis. That is, when more cooling is required in the bladecenter chassis (104), the fan speed may be increased, when less cooling is required the fan speed may be decreased. The fan speed of the fan (110) may be dynamically set during bladecenter operations by the management module (102). The management module (102) may set such fan speeds through an out-of-band data communications link. An out-of-band communications link is a communications link for out-of-band communications of data and instructions between a management module and a computing device. Examples of out-of-band communications links include:

The System Management Bus ('SMBus'), a two-wire bus used for communication with low-bandwidth devices on a motherboard, especially power related chips such as a laptop's rechargeable battery subsystem, temperature sensors, and lid switches.

I²C bus, a serial computer bus invented by Philips that is used to for low-speed communications with peripheral components of a system. The name stands for Inter-Integrated Circuit and is pronounced I-squared-C or sometimes as I-two-C.

The Universal Serial Bus ('USB'), a serial bus standard for communications designed to allow a peripheral to be connected without an expansion cards, and to improve plug-and-play capabilities by allowing devices to be hot-swapped. Originally designed for computers, its flexibility has placed USB buses on video game consoles, PDAs, portable DVD and media players, cellphones, and even devices such as televisions, home stereo equipment, digital audio players, car stereos, and portable memory devices.

The bladecenter chassis (104) of FIG. 1 also includes a filter monitoring module (120) connected for data communications to the management module (102). The filter monitoring module (120), like the fan (110), may be connected to the management module (102) for data communications through an out-of-band communications link. In some embodiments the fan is connected to the out-of-band communications link through an I²C bus, while the filter monitoring module (120) is connected to the management module via USB.

The example filter monitoring module (120) of FIG. 1 is an aggregation of computer hardware and software useful for detecting a fouled air filter in a computer equipment enclosure. The filter monitoring module is capable of calculating a pressure differential across the air filter (112); determining, for the current fan speed of the fan (110) by the filter monitoring module (120) in dependence upon a pressure differential profile (206) for the air filter (112), whether the calculated pressure differential across the air filter (112) exceeds a predetermined threshold value; and if the calculated pressure differential across the air filter exceeds the predetermined threshold value, reporting, by the filter monitoring module (120) to the management module (102), that the calculated pressure differential across the air filter exceeds the predetermined threshold value.

For one particular fan speed, the pressure differential across the filter (112) increases as particulate materials build up on the filter. That is, the more 'fouled' the air filter (112) becomes the greater the pressure differential across the air filter for the one particular fan speed. As mentioned above, however, the fan may operate at many different fan speeds. Each different fan speed affects the air pressure within the supply plenum differently and, as such, affects the pressure differential across the air filter differently. That is, not only may particulate material build-up on the air filter (112) affect pressure differential across the air filter, but the current fan speed may also affect the pressure differential. The filter monitoring module of FIG. 1 is therefore said to determine whether the calculated pressure differential exceeds a predetermined threshold value for a current fan speed.

The filter monitoring module (120) may calculate a pressure differential across the air filter further by: determining, from the ambient pressure sensor (116), an air pressure outside the computer equipment enclosure; determining, from the plenum pressure sensor (118), air pressure inside the supply plenum (108); and calculating the difference of the air pressure outside the computer equipment enclosure and the air pressure inside the supply plenum.

A pressure sensor is a device used to measure pressure of gases or liquids, and in this specification air. Pressure is an expression of the force required to stop a gas or fluid from expanding, and is usually stated in terms of force per unit area. A pressure sensor may generate a signal related to the pressure imposed, such as an electrical signal, or optical signals, and so on. The pressure sensors in the example of FIG. 1 may measure air pressure relative to a perfect vacuum, zero PSI, or relative to atmospheric pressure, 14.7 PSI. A pressure sensor device may be implemented with such example technologies as fiber optic technologies, mechanical technologies, semiconductor piezoresistive technologies, microelectromechanical system technologies, vibrating element technologies, variable capacitance technologies and others as may occur to readers of skill in the art. Such pressure sensors (116, 118) may be connected to the filter monitoring module (120) through a wireline link, such as an I²C communications link, or wirelessly through Radio Frequency ('RF') transmission, Infrared ('IR') transmission, and so on as will occur to those of skill in the art.

A bladecenter chassis (104) according to embodiments of the present invention may include one or more status Light Emitting Diodes ('LEDs') designated for visual indications of a fouled air filter. If the pressure differential across the air filter (112) exceeds a predetermined threshold value, the filter monitoring module (120) may initiate a visual indication of a fouled air filter. In the example of FIG. 1, the filter monitoring module (120) may initiate a visual indication of a fouled air filter by activating the LED (124) on the bladecenter chassis (104).

Only one fan (110) and one air filter (112) are described in the example of FIG. 1 for clarity, not limitation. Readers of skill in the art will immediately recognize that bladecenter chassis useful in detecting a fouled air filter in accordance with embodiments of the present invention may include any number of air filters and fans as may occur to those of skill in the art. A bladecenter chassis in which more than one air filter is installed may be configured according to embodiments of the present invention with one filter monitoring module (120) and one pair of pressure sensors for each installed air filter, or alternatively, with a pair of pressure sensors for each air filter where all pairs of pressure sensors are connected to a single filter monitoring module.

The arrangement of servers and other devices making up the exemplary system illustrated in FIG. 1 are for explanation, not for limitation. Data processing systems useful according to various embodiments of the present invention may include additional power supplies, servers, routers, other devices, and peer-to-peer architectures, not shown in FIG. 1, as will occur to those of skill in the art. In-band data communications networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
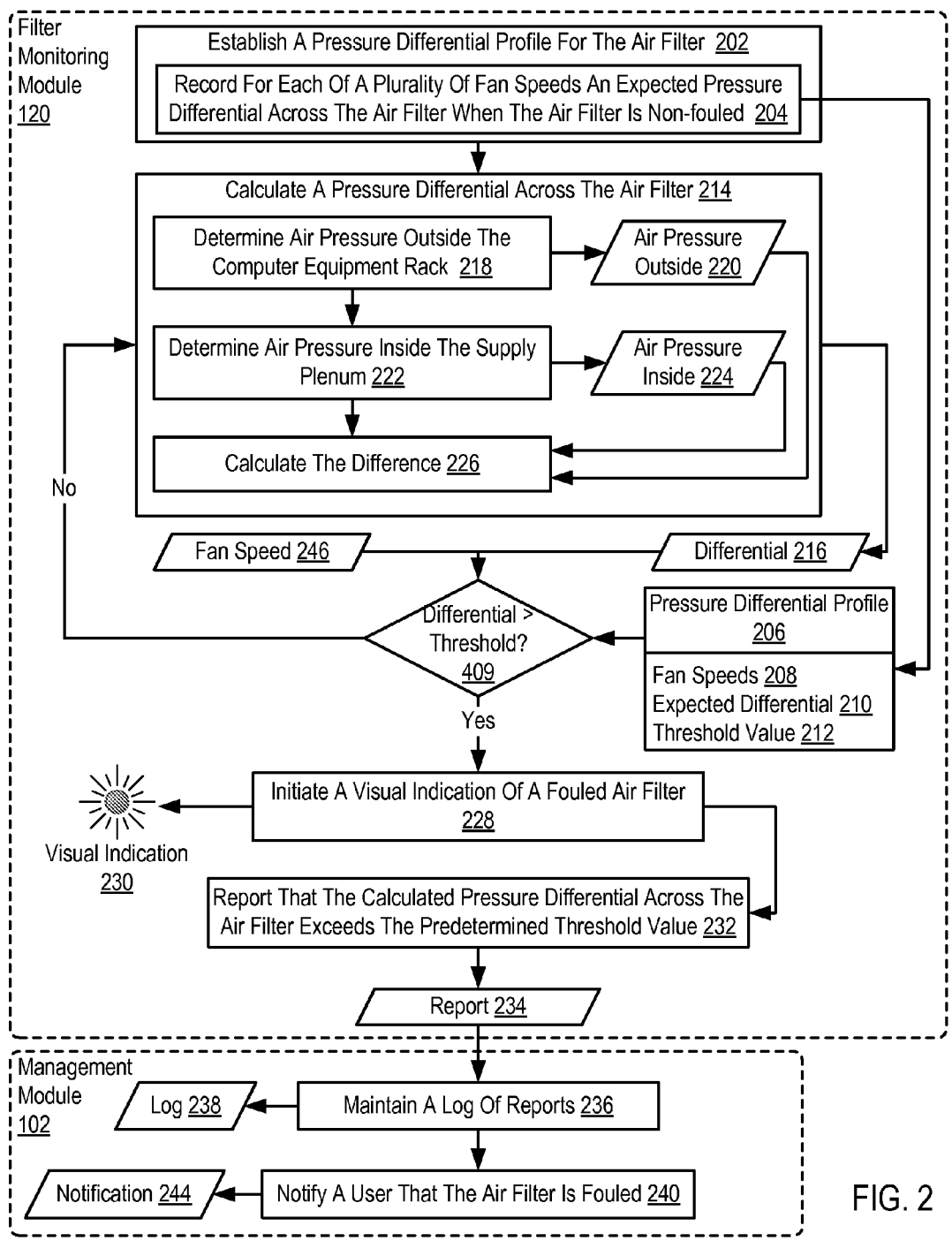
FIG. 2 sets forth a flow chart illustrating an exemplary method for detecting a fouled air filter in a computer equipment enclosure according to embodiments of the present invention.

For further explanation, FIG. 2 sets forth a flow chart illustrating an exemplary method for detecting a fouled air filter in a computer equipment enclosure according to embodiments of the present invention. The computer equipment enclosure in the example of FIG. 2 includes an air filter, a supply plenum connecting the air filter and the computer equipment enclosure, and a fan operating at a current fan speed (246). In the example of FIG. 2, the fan provides airflow across computer equipment installed in the computer equipment enclosure. The computer equipment enclosure also includes a filter monitoring module (120) connected for data communications to a management module (102). The example management module (102) of FIG. 2 is capable of managing the computer equipment enclosure and computer equipment installed in the computer equipment enclosure.

The method of FIG. 2 includes calculating (214), by the filter monitoring module (102), a pressure differential (216) across the air filter. In the method of FIG. 2, calculating (214), by the filter monitoring module (102), a pressure differential (216) across the air filter is carried out by determining (218), from a pressure sensor located outside the computer equipment enclosure, air pressure outside (220) the computer equipment enclosure; determining (222), from a pressure sensor located inside the supply plenum, air pressure inside (224) the supply plenum; and calculating (226) the difference of the air pressure outside (220) the computer equipment enclosure and the air pressure inside (224) the supply plenum.

The method of FIG. 2 also includes determining (409), for the current fan speed (246) by the filter monitoring module (120) in dependence upon a pressure differential profile (206) for the air filter, whether the calculated pressure differential (216) across the air filter exceeds a predetermined threshold value (212). The filter monitoring module (120) may query the management module (102) through an out-of-band communications link for the current fan speed (246).

A pressure differential profile for an air filter is a specification of expected pressure differentials across the air filter for a set of different fan speeds. A pressure differential profile may be implemented as a data structure, such as a table for example, that associates expected pressure differentials and fan speeds. A pressure differential profile may also be an algorithm that uses as an input a current fan speed and determines for the current fan speed an expected pressure differential. Consider, for clarity of explanation, an example record of a pressure different profile implemented as a table that associates an expected pressure differential of 1.2 PSI with a fan speed of 2500 revolutions per minute.

The predetermined threshold value (212) may be implemented as part of the pressure differential profile or as a implemented through configuration of the filter monitoring module. The predetermined threshold value (212) may be implemented as a percentage of expected pressure differentials, an explicit pressure differential for each fan speed, or in other ways as will occur to those of skill in the art. Consider for example, a predetermined threshold that specifies that a calculated pressure differential must be no more than 10% greater than the expected pressure differential at the current fan speed.

The steps of calculating (214) a pressure differential across the air filter and determining whether the calculated pressure differential (216) exceeds a predetermined threshold value (212) may be carried out periodically, at the behest of the management module (102), or upon a change of fan speed. Alternatively, the steps of calculating (214) a pressure differential across the air filter and determining whether the calculated pressure differential (216) exceeds a predetermined threshold value (212) may be carried out continually in a control loop, such that, the filter monitoring module immediately detects a fouled air filter in the computer equipment enclosure.

The method of FIG. 2 also includes establishing (202) the pressure differential profile (206) for the air filter. In the method of FIG. 2, establishing (202) the pressure differential profile (206) for the air filter is carried out by recording (204) for each of a plurality of fan speeds an expected pressure differential (210) across the air filter when the air filter is non-fouled. Establishing the pressure differential profile (206) may be carried out by the management module (102) by executing a software utility application designated to establish such a pressure differential profile (206) for an air filter at the behest of a system administrator or upon detection of a newly installed air filter. Alternatively, a pressure differential profile for an air filter may be established by a manufacturer of the air filter and provided to the management module through a web site designated for such a purpose or on a recording medium included with the air filter when purchased.

If the calculated pressure differential (216) across the air filter exceeds the predetermined threshold value (212), the method of FIG. 2 continues by initiating (228) a visual indication (230) of a fouled air filter and reporting (232), by the filter monitoring module (120) to the management module (102), that the calculated pressure differential (216) across the air filter exceeds the predetermined threshold value (212). Reporting (232), by the filter monitoring module (120) to the management module (102), that the calculated pressure differential (216) across the air filter exceeds the predetermined threshold value (212) may be carried out by sending a report (234) to the management module (102) through an out-of-band communications link. Such a report may include, a timestamp indicating the time at which of the report (234), the calculated air pressure differential (216), the current fan speed (246), the expected pressure differential (210), and the predetermined threshold value (212).

The method of FIG. 2 also includes maintaining (236) by the management module (102) a log (238) of reports (234) received from the filter monitoring module (120). Maintaining (236) by the management module (102) a log (238) of reports (234) received from the filter monitoring module (120) may be carried out by recording, for each report received from the filter monitoring module, in a data structure such as a table, a timestamp indicating the time at which the report was received, the calculated air pressure differential (216), the current fan speed (246), the expected pressure differential (210), and the predetermined threshold value (212). Such a log can be reviewed periodically by a system administrator to determine whether to replace, remove, or service the air filter.

The method of FIG. 2 also includes notifying (240) a user, by the management module (102) upon receipt of the report (234) that the calculated pressure differential (216) across the air filter exceeded the predetermined threshold value (212), that the air filter is fouled. Notifying (240) a user may be carried out by displaying for a system administrator in a graphical user interface of a system management application a notification (244) indicating a detection of a fouled air filter. Such a notification, if the computer equipment enclosure has many different monitored air filters installed, may also particularly identify the fouled air filter by identifying the particular rack or slot which the fouled air filter is installed. Such a notification, if the management module (240) manages multiple computer equipment enclosures may also particularly identify the fouled air filter by identifying the particular computer equipment enclosure in which the fouled air filter is installed.

In view of the explanations set forth above, readers will recognize that the benefits of detecting a fouled air filter in a computer equipment enclosure according to embodiments of the present invention include:

protecting electronic equipment from overheating due to a fouled air filter;

lowering costs associated with air filter monitoring by carrying out the monitoring automatically without human intervention, that is, by eliminating the need for periodic visual inspection of the air filter by a data center technician or the like eliminating the need for manual record-keeping of periodic air filter maintenance checks through active and automatic logging of monitoring alerts;

providing alerts for users of a fouled air filter in the form of GUI notifications, a log, or a visual indication, on the enclosure itself, and others as will occur to readers of skill in the art.

Exemplary embodiments of the present invention are described largely in the context of a fully functional computer system for detecting a fouled air filter in a computer equipment enclosure. Readers of skill in the art will recognize, however, that the present invention also may be embodied in a computer program product disposed on signal bearing media for use with any suitable data processing system. Such signal bearing media may be transmission media or recordable media for machine-readable information, including magnetic media, optical media, or other suitable media. Examples of recordable media include magnetic disks in hard drives or diskettes, compact disks for optical drives, magnetic tape, and others as will occur to those of skill in the art. Examples of transmission media include telephone networks for voice communications and digital data communications networks such as, for example, Ethernets™ and networks that communicate with the Internet Protocol and the World Wide Web as well as wireless transmission media such as, for example, networks implemented according to the IEEE 802.11 family of specifications. Persons skilled in the art will immediately recognize that any computer system having suitable programming means will be capable of executing the steps of the method of the invention as embodied in a program product. Persons skilled in the art will recognize immediately that, although some of the exemplary embodiments described in this specification are oriented to software installed and executing on computer hardware, nevertheless, alternative embodiments implemented as firmware or as hardware are well within the scope of the present invention.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of detecting a fouled air filter in a computer equipment enclosure, the computer equipment enclosure comprising:

an air filter, a supply plenum connecting the air filter and the computer equipment enclosure, a fan operating at a current fan speed, the fan providing airflow across computer equipment installed in the computer equipment enclosure, and a filter monitoring module connected for data communications to a management module, the management module capable of managing the computer equipment enclosure and computer equipment installed in the computer equipment enclosure, the method comprising:

calculating, by the filter monitoring module, a pressure differential across the air filter, further comprising:

determining, from a first pressure sensor located outside the computer equipment enclosure, air pressure outside the computer equipment enclosure;

determining, from a second pressure sensor located inside the supply plenum, air pressure inside the supply plenum; and calculating the difference of the air pressure outside the computer equipment enclosure and the air pressure inside the supply plenum;

determining, for the current fan speed by the filter monitoring module in dependence upon a pressure differential profile for the air filter, whether the calculated pressure differential across the air filter exceeds a predetermined threshold value; and if the calculated pressure differential across the air filter exceeds the predetermined threshold value, reporting, by the filter monitoring module to the management module, that the calculated pressure differential across the air filter exceeds the predetermined threshold value.

2. The method of claim 1 further comprising:

establishing the pressure differential profile for the air filter including recording for each of a plurality of fan speeds an expected pressure differential across the air filter when the air filter is non-fouled.

3. The method of claim 1 further comprising notifying a user, by the management module upon receipt of the report that the calculated pressure differential across the air filter exceeded the predetermined threshold value, that the air filter is fouled.

4. The method of claim 1 further comprising:

if the calculated pressure differential across the air filter exceeds the predetermined threshold value, initiating a visual indication of a fouled air filter.

5. The method of claim 1 further comprising:

maintaining by the management module a log of reports received from the filter monitoring module.

6. An apparatus for detecting a fouled air filter in a computer equipment enclosure, the computer equipment enclosure comprising:

an air filter, a supply plenum connecting the air filter and the computer equipment enclosure, a fan operating at a current fan speed, the fan providing airflow across computer equipment installed in the computer equipment enclosure, and a filter monitoring module connected for data communications to a management module, the management module capable of managing the computer equipment enclosure and computer equipment installed in the computer equipment enclosure, the apparatus comprising a computer processor, a computer memory operatively coupled to the computer processor, the computer memory having disposed within it computer program instructions capable of:

calculating, by the filter monitoring module, a pressure differential across the air filter, further comprising:

determining, from a first pressure sensor located outside the computer equipment enclosure, air pressure outside the computer equipment enclosure;

determining, from a second pressure sensor located inside the supply plenum, air pressure inside the supply plenum; and calculating the difference of the air pressure outside the computer equipment enclosure and the air pressure inside the supply plenum;

determining, for the current fan speed by the filter monitoring module in dependence upon a pressure differential profile for the air filter, whether the calculated pressure differential across the air filter exceeds a predetermined threshold value; and if the calculated pressure differential across the air filter exceeds the predetermined threshold value, reporting, by the filter monitoring module to the management module, that the calculated pressure differential across the air filter exceeds the predetermined threshold value.

7. The apparatus of claim 6 further comprising computer program instructions capable of:

establishing the pressure differential profile for the air filter including recording for each of a plurality of fan speeds an expected pressure differential across the air filter when the air filter is non-fouled.

8. The apparatus of claim 6 further comprising computer program instructions capable of notifying a user, by the management module upon receipt of the report that the calculated pressure differential across the air filter exceeded the predetermined threshold value, that the air filter is fouled.

9. The apparatus of claim 6 further comprising computer program instructions capable of:

if the calculated pressure differential across the air filter exceeds the predetermined threshold value, initiating a visual indication of a fouled air filter.

10. The apparatus of claim 6 further comprising computer program instructions capable of:

maintaining by the management module a log of reports received from the filter monitoring module.

11. A computer program product for detecting a fouled air filter in a computer equipment enclosure, the computer equipment enclosure comprising:

an air filter, a supply plenum connecting the air filter and the computer equipment enclosure, a fan operating at a current fan speed, the fan providing airflow across computer equipment installed in the computer equipment enclosure, and a filter monitoring module connected for data communications to a management module, the management module capable of managing the computer equipment enclosure and computer equipment installed in the computer equipment enclosure, the computer program product disposed in a computer readable signal bearing medium, the computer program product comprising computer program instructions capable of:

calculating, by the filter monitoring module, a pressure differential across the air filter, further comprising:

determining, from a first pressure sensor located outside the computer equipment enclosure, air pressure outside the computer equipment enclosure;

determining, from a second pressure sensor located inside the supply plenum, air pressure inside the supply plenum; and calculating the difference of the air pressure outside the computer equipment enclosure and the air pressure inside the supply plenum;

determining, for the current fan speed by the filter monitoring module in dependence upon a pressure differential profile for the air filter, whether the calculated pressure differential across the air filter exceeds a predetermined threshold value; and if the calculated pressure differential across the air filter exceeds the predetermined threshold value, reporting, by the filter monitoring module to the management module, that the calculated pressure differential across the air filter exceeds the predetermined threshold value.

12. The computer program product of claim 11 further comprising computer program instructions capable of:

establishing the pressure differential profile for the air filter including recording for each of a plurality of fan speeds an expected pressure differential across the air filter when the air filter is non-fouled.

13. The computer program product of claim 11 further comprising computer program instructions capable of notifying a user, by the management module upon receipt of the report that the calculated pressure differential across the air filter exceeded the predetermined threshold value, that the air filter is fouled.

14. The computer program product of claim 11 further comprising computer program instructions capable of:

if the calculated pressure differential across the air filter exceeds the predetermined threshold value, initiating a visual indication of a fouled air filter.

15. The computer program product of claim 11 further comprising computer program instructions capable of:

maintaining by the management module a log of reports received from the filter monitoring module.

\* \* \* \* \*